(12) United States Patent
Burrows et al.

(10) Patent No.: US 10,072,177 B2
(45) Date of Patent: Sep. 11, 2018

(54) STRETCHABLE POLYMER THICK FILM COMPOSITIONS FOR THERMOPLASTIC SUBSTRATES AND WEARABLES ELECTRONICS

(71) Applicant: E I DU PONT DE NEMOURS AND COMPANY, Wilmington, DE (US)

(72) Inventors: Michael Zanoni Burrows, Raleigh, NC (US); Mark Steven Critzer, Morrisville, NC (US); Jay Robert Dorfman, Durham, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 170 days.

(21) Appl. No.: 14/929,498

(22) Filed: Nov. 2, 2015

(65) Prior Publication Data

US 2016/0130471 A1    May 12, 2016

Related U.S. Application Data

(60) Provisional application No. 62/170,912, filed on Jun. 4, 2015, provisional application No. 62/076,006, filed on Nov. 6, 2014.

(51) Int. Cl.

| | | |
|---|---|---|
| *C09D 175/04* | (2006.01) | |
| *C09D 175/08* | (2006.01) | |
| *H01B 1/22* | (2006.01) | |
| *C09D 5/24* | (2006.01) | |
| *H05K 1/03* | (2006.01) | |
| *H05K 1/09* | (2006.01) | |
| *C08K 3/08* | (2006.01) | |
| *C08K 3/36* | (2006.01) | |
| *H05K 1/02* | (2006.01) | |

(52) U.S. Cl.
CPC ............ *C09D 175/08* (2013.01); *C09D 5/24* (2013.01); *H01B 1/22* (2013.01); *H05K 1/0326* (2013.01); *H05K 1/0346* (2013.01); *H05K 1/09* (2013.01); *H05K 1/095* (2013.01); *C08K 3/08* (2013.01); *C08K 3/36* (2013.01); *C08K 2003/0806* (2013.01); *H05K 1/0283* (2013.01); *H05K 2201/0129* (2013.01)

(58) Field of Classification Search
CPC ...... H05K 1/09; H05K 1/0346; H05K 1/0326; H05K 1/00; H05K 2201/0129; H05K 1/0283; C09D 5/24; C09D 175/08; C09D 175/04; C09D 175/06; H01B 1/22; C08K 3/08; C08K 2003/0806; C08K 3/36
USPC ............ 252/511, 514, 62.3 Q; 174/251, 257; 524/590

See application file for complete search history.

(56) References Cited

U.S. PATENT DOCUMENTS

| | | | | |
|---|---|---|---|---|
| 3,746,662 | A * | 7/1973 | Adelman ................. | H01B 1/22 252/512 |
| 5,565,143 | A | 10/1996 | Chan | |
| 7,348,062 | B2 * | 3/2008 | Yuan ................. | B32B 17/10018 428/425.6 |
| 8,003,198 | B2 | 8/2011 | Park et al. | |
| 8,818,478 | B2 | 8/2014 | Scheffler et al. | |
| 8,945,328 | B2 | 2/2015 | Longinotti-Buitoni et al. | |
| 8,948,839 | B1 | 2/2015 | Longinotti Buitoni et al. | |
| 9,253,883 | B2 * | 2/2016 | Critzer ..................... | H01B 1/22 |
| 2009/0169724 | A1 | 7/2009 | Ogiwara | |
| 2012/0177934 | A1 * | 7/2012 | Vogel ..................... | H01L 41/29 428/457 |
| 2014/0178601 | A1 | 1/2014 | Wei et al. | |
| 2014/0154501 | A1 | 6/2014 | Dorfman et al. | |
| 2015/0102272 | A1 | 4/2015 | Dong et al. | |
| 2015/0137048 | A1 | 5/2015 | Critzer et al. | |
| 2016/0039968 | A1 * | 2/2016 | Rukavina .............. | B29C 67/246 428/174 |

FOREIGN PATENT DOCUMENTS

| | | |
|---|---|---|
| WO | 2012/028686 A2 | 3/2012 |
| WO | 2012028686 A2 | 3/2012 |
| WO | 2014113937 A1 | 7/2014 |

OTHER PUBLICATIONS

International Search Report dated Apr. 11, 2016 for International Patent Application No. PCT/US2015/058810.
International Search Report dated Jan. 18, 2016 for International Application No. PCT/US2015/058810.

* cited by examiner

*Primary Examiner* — Douglas J McGinty

(57) ABSTRACT

This invention is directed to stretchable polymer thick film compositions useful for wearable garments. More specifically, the polymer thick film may be used in applications where significant stretching is required, particularly on substrates that can be highly elongated. A particular type of substrate is a thermoplastic polyurethane substrate.

2 Claims, No Drawings

STRETCHABLE POLYMER THICK FILM COMPOSITIONS FOR THERMOPLASTIC SUBSTRATES AND WEARABLES ELECTRONICS

FIELD OF THE INVENTION

This invention is directed to polymer thick film compositions. More specifically, the polymer thick film composition may be used in applications where significant stretching is required, particularly on substrates that can be highly elongated. A particular type of substrate which is suitable is a thermoplastic polyurethane (TPU) substrate that can be used in wearable garments applications. Another approach utilizes printing directly onto the fabric alone, either containing conductive filler like carbon or silver, or without conductive filler, either woven or knit, to produce stretchable conductive traces and sensors.

BACKGROUND OF THE INVENTION

Conductive polymer thick film (PTF) circuits have long been used as electrical elements. Although they have been used as electrical elements, the use of PTF silver conductors in highly stretchable applications such as for wearable garments is not common. The ability to be stretched and exposed to multiple wash and dry cycles and still maintain conductivity is critical. Additionally, one typical substrate used for this type of application is a thermoplastic polyurethane substrate (TPU substrate), and the PTF compositions must be compatible with this substrate. One of the purposes of this invention is to address the above requirements and produce a series of stretchable PTF inks that can be used in the construction of a functional circuit to be used on a substrate which may be used as a wearable garment or which can be applied to a fabric which may be used as a wearable garment.

SUMMARY OF THE INVENTION

This invention provides a polymer thick film composition comprising:
   (a) a functional component; and
   (b) an organic medium comprising 5-50 wt % thermoplastic polyurethane resin dissolved in an organic solvent, the thermoplastic polyurethane having a per cent elongation of at least 200% and a tensile stress necessary to achieve 100% elongation of less than 1000 psi, wherein the weight percent is based on the total weight of the organic medium.

The choice of the functional component determines the properties of the composition and the kind of polymer thick film that can be formed from the composition.

In one embodiment, the functional component is an electrically conductive powder and the invention provides a polymer thick film conductor composition comprising:
   (a) an electrically conductive metal powder, wherein the metal is selected from the group consisting of Ag, Cu, Au, Pd, Pt, Sn, Al, Ni, an alloy of Ag, Cu, Au, Pd, Pt, Sn, Al, Ni and mixtures thereof; and
   (b) an organic medium comprising 5-50 wt % thermoplastic polyurethane resin dissolved in an organic solvent, the thermoplastic polyurethane having a per cent elongation of at least 200% and a tensile stress necessary to achieve 100% elongation of less than 1000 psi, wherein the weight percent is based on the total weight of the organic medium.

In another embodiment, the functional component is silver powder in combination with silver chloride powder and the invention provides a polymer thick film conductor composition comprising:
   (a) silver powder in combination with silver chloride powder; and
   (b) an organic medium comprising 5-50 wt % thermoplastic polyurethane resin dissolved in an organic solvent, the thermoplastic polyurethane having a per cent elongation of at least 200% and a tensile stress necessary to achieve 100% elongation of less than 1000 psi, wherein the weight percent is based on the total weight of the organic medium.

In yet another embodiment, the functional component is graphite, conductive carbon or a mixture thereof and the invention provides a polymer thick film overcoat composition comprising:
   (a) graphite, conductive carbon or a mixture thereof; and
   (b) an organic medium comprising 5-50 wt % thermoplastic polyurethane resin with a % elongation of at least 200% dissolved in an organic solvent, wherein the weight percent is based on the total weight of the organic medium.

In still another embodiment, the functional component is fumed silica and the invention provides a polymer thick film encapsulant composition comprising:
   (a) fumed silica; and
   (b) an organic medium comprising 5-50 wt % thermoplastic polyurethane resin with a % elongation of at least 200% dissolved in an organic solvent, wherein the weight percent is based on the total weight of the organic medium.

The invention is further directed to using the highly stretchable compositions to form conductive electrical circuits and overcoats and encapsulants to protect these circuits on substrates for wearable garments.

DETAILED DESCRIPTION OF INVENTION

The invention relates to polymer thick film compositions for use in electrical circuits and, in particular, highly stretchable deformed circuits such as those applications where functional circuitry is generated on fabrics for clothing. This is often referred to as wearables electronics. A layer of conductor is printed and dried on a substrate so as to produce a functioning circuit and then the entire circuit is subjected to the typical bending/creasing that a fabric would receive. Additionally, as is typical for fabrics, they must be washed and dried on a periodic basis and the conductivity and integrity of the conductor must be maintained.

The substrates commonly used in polymer thick film circuits are polyester (PET), polycarbonate and others. However, those cannot be used here. However, it has been found that one particular class of substrates, thermoplastic polyurethane substrates (TPU's), along with the series of polymer thick film compositions disclosed herein produce stretchable circuits that can be used in making wearable electronics in washable garments.

In some embodiments, the electrically conductive metal powder of the polymer thick film (PTF) conductor composition is comprised of (i) silver flakes, or silver flakes and silver chloride powder or graphite, conductive carbon or mixtures thereof and (ii) an organic medium comprising a polymer resin dissolved in an organic solvent. When the electrically conductive metal powder is replaced by fumed silica, the PTF composition serves as an encapsulant. Additionally, other powders and printing aids may be added to improve the composition.

Herein weight percent is written as wt %.

Conductor Compositions

When the functional component is an electrically conducting material, the composition can be used to form an electrical conductor.

In one embodiment the electrically conductive metal powder is a powder of electrically conductive metal particles. The electrically conductive metal is selected from the group consisting of Ag, Cu, Au, Pd, Pt, Sn, Al, Ni, an alloy of Ag, Cu, Au, Pd, Pt, Sn, Al, Ni and mixtures thereof. In an embodiment, the conductive particles include silver (Ag). In a further embodiment, the conductive particles may, for example, include one or more of the following: Ag, Cu, Au, Pd, Pt, Sn, Al, Ni, Ag—Pd and Pt—Au. In another embodiment, the conductive particles include one or more of the following: (1) Al, Cu, Au, Ag, Pd and Pt; (2) an alloy of Al, Cu, Au, Ag, Pd and Pt; and (3) mixtures thereof. In still another embodiment, the conductive particles include one of the above mentioned metals coated with another of the metals, e.g., Ag-coated Cu, Ag-coated-Ni. An embodiment contains a mixture of any of the above.

In one such embodiment, the electrically conductive powders in the present thick film composition are silver powders and may comprise silver metal powder, alloys of silver metal powder, or mixtures thereof. Various particle diameters and shapes of the conductive powder are contemplated. In an embodiment, the conductive powder may include any shape silver powder, including spherical particles, flakes (rods, cones, plates), and mixtures thereof. In one embodiment, the conductive powder is in the form of silver flakes.

In an embodiment, the particle size distribution of the conductive powders may be 1 to 100 microns; in a further embodiment, 2-10 microns.

In an embodiment, the surface area/weight ratio of the silver particles may be in the range of 0.1-1.0 m$^2$/g.

Furthermore, it is known that small amounts of other metals may be added to silver conductor compositions to improve the properties of the conductor. Some examples of such metals include: gold, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition.

In various embodiments, the electrically conductive metal powder may be present at 20 to 92 wt %, 30 to 70 wt %, or 45 to 65 wt % based on the total weight of the composition.

In another conductor embodiment, the functional component is silver powder in combination with silver chloride powder. This combination is present at 20 to 92 wt %, based on the total weight of the composition. The ratio of the weight of the silver powder to the weight of the silver chloride powder is in the range of 9 to 1 to 0.1 to 1. In one embodiment the silver powder is in the form of silver flakes.

The functional powder may consist of graphite, conductive carbon or mixtures and the resulting composition can be used as a protective ink to form an overcoat. The amount of graphite, conductive carbon or mixtures may be present at 20 to 92 wt %, based on the total weight of the composition.

Organic Medium

The organic medium is comprised of a thermoplastic polyurethane resin dissolved in an organic solvent. The polyurethane resin must achieve good adhesion to an underlying substrate. The polyurethane resin must be compatible with and not adversely affect the performance of the circuit after deformation and wash and dry cycles.

In one embodiment the thermoplastic polyurethane resin is 5-50 wt % of the total weight of the organic medium. In another embodiment the thermoplastic polyurethane resin is 20-45 wt % of the total weight of the organic medium and in still another embodiment the thermoplastic polyurethane resin is 23-30 wt % of the total weight of the organic medium. In an embodiment the thermoplastic polyurethane resin is a polyurethane homopolymer. In another embodiment the polyurethane resin is a polyester-based copolymer. In one embodiment the thermoplastic polyurethane resin is a predominantly linear hydroxyl polyurethane.

The thermoplastic polyurethane resin has a % elongation of at least 200%.

Percent elongation is defined in the usual way:

$$\text{Percent Elongation} = \frac{\text{Final Length} - \text{Initial Length}}{\text{Initial Length}} \times 100$$

The thermoplastic polyurethane resin also has a tensile stress necessary to achieve 100% elongation of less than 1000 pounds per square inch (psi).

The polymer resin is typically added to the organic solvent by mechanical mixing to form the medium. Solvents suitable for use in the polymer thick film composition are recognized by one of skill in the art and include acetates and terpenes such as carbitol acetate and alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points (in the range of 180° C. to 250° C.), and mixtures thereof may be used. Various combinations of these and other solvents are formulated to obtain the viscosity and volatility requirements desired. The solvents used must solubilize the resin. Solvent may be added to the composition to adjust the viscosity and may be considered part of the organic medium.

In various embodiments, the organic medium may be present at 8 to 80 wt %, 30 to 70 wt %, or 35 to 55 wt % based on the total weight of the composition.

Overcoat Compostion

A particular conductor version of the compositions of the invention may be formulated to be used as an overcoat to protect the conductor formed from the polymer thick film conductor compositions discussed above from the harsh environment of the wash and dry cycles. The polymer thick film overcoat composition is formulated by using graphite, conductive carbon or a mixture thereof and the organic medium mentioned above. The overcoat results in a minimal shift in resistance of the conductor with wash and dry cycles.

Encapsulant Composition

A non-conductor version of the compositions of the invention may also be formulated. This type of encapsulant or dielectric is very useful in that it protects the conductors from the harsh environment of the wash and dry cycles. The composition may be directly deposited onto the conductor or be applied over an overcoat layer. This composition is formulated by using only the organic medium mentioned above with the addition of fumed silica as a powder and/or the addition of a dye as needed. The amount of fumed silica used is from 0.1 to 3 wt % and the amount of organic medium is from 97 to 99.9 wt %, based on the total weight of the composition. In one embodiment, the amount of fumed silica used is from 0.5 to 1.5 wt % and the amount of organic medium is from 98.5 to 99.5 wt %, based on the total weight of the composition.

Additional Powders

Various powders or additives may be added to the PTF compositions to improve adhesion, modify the rheology and increase the low shear viscosity thereby improving the printability.

Application of the PTF Compositions

The PTF compositions, also referred to as "pastes", are deposited on a substrate which may be used as a wearable garment or which can be applied to a fabric which may be used as a wearable garment. One substrate is a thermoplastic polyurethane substrate, such as Bemis ST-604 available from Bemis Associates, Inc., Shirley, Mass. Another possible substrate is a thermoplastic polyester, such as Hytrel® available from the DuPont Co., Wilmington, Del. The substrate can also be a sheet of a composite material made up of a combination of plastic sheet with a permeable coating deposited thereupon.

The deposition of the PTF compositions on the substrate are performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate functional properties to the composition. For example, the functional phase may comprise electrically functional powders dispersed in an organic medium that acts as a carrier for the functional phase. Generally, the composition is fired to burn out both the polymer and the solvent of the organic medium and to impart the electrically functional properties. However, in the case of a polymer thick film composition, the polymer portion of the organic medium remains as an integral part of the composition after drying.

The PTF compositions are processed for a time and at a temperature necessary to remove all solvent. For example, the deposited thick film is dried by exposure to heat at 130° C. for typically 10-15 min.

Circuit Construction

The base substrate used is typically 5 mil thick TPU. The conductor composition is printed and dried as per the conditions described above. One or more layers of the conductor PTF composition can be printed and dried on the substrate and a protective overcoat and/or protective encapsulant layer can be applied over the dried conductor PTF composition and dried. In one embodiment the conductor is covered by an overcoat layer formed from the polymer thick film overcoat composition of the invention. In another embodiment the conductor is covered by an encapsulant layer formed from the polymer thick film encapsulant composition of the invention. In still another embodiment the conductor is covered by an overcoat layer formed from the polymer thick film overcoat composition of the invention which is then covered by an encapsulant layer formed from the polymer thick film encapsulant composition of the invention.

The base substrate may be used directly as a wearable garment. Alternatively, the substrate may be applied to a fabric which can be used to form a wearable garment. Either side of the substrate may be applied to the fabric, i.e., the side of the substrate with the conductor can be adjacent to the fabric or the other side of the substrate may be adjacent to the fabric. A thermoplastic polyurethane substrate, such as Bemis ST-604, adheres to polyurethane or polyvinyl chloride coated fabrics, In another embodiment the conductor composition may be applied directly to a stretchable permeable fabric. One such non-woven fabric is one constructed from Evolon® available from Fruedenberg Evolon, Colmar, France. Another permeable substrate that may be used for this type of application is a woven polyester coated with polyamide, e.g., Cetus® OS5000U available from Dynic Corp, Kyoto, Japan.

The depositions of the PTF compositions can be applied to a TPU film, then laminated to a fabric structure, or printed directly onto a fabric, containing conductive filler in the fiber or onto knit, woven, or nonwoven fabric constructions. In the instance of printing directly on the fabric conductive ink systems can be in the form of screen-printing, or other non-contact method such as aerosol, extrusion printing, or injet. A typical process would be to apply an insulating layer of thermoplastic, UV, or combination of both to act as a base layer to prevent subsequent layers of conductive inks such as silver or carbon from bleeding through or interacting electrically with a conductive fabric structure. The next prints would be the conductive inks, followed by insulating thermoplastic, UV, or combination of insulators including a top layer of TPU adhesive or moisture barrier film.

EXAMPLES AND COMPARATIVE EXPERIMENTS

Example 1

The PTF conductor composition was prepared in the following manner. 40.0 parts by weight of an organic medium was used and was prepared by mixing 28.5 wt % Desmocoll® 406 polyurethane (Bayer Material Science LLC, Pittsburgh, Pa.) with 71.5 wt % Dowanol™ DPM glycol ether (obtained from Dow Co., Midland Mich.) organic solvent. The molecular weight of the resin was approximately 20,000. This mixture was heated at 90° C. for 1-2 hours to dissolve all the resin. 60.00 parts by weight of a flake silver powder with an average particle size of approximately 5 microns was added. Finally, approximately 12.75 parts by weight of the Dowanol™ DPM glycol ether was added for thinning purposes to bring the composition to a desired viscosity.

This composition was mixed for 30 minutes on a planetary mixer, and then subjected to several passes on a three roll-mill.

A circuit was then fabricated as follows. On a 5 mil thick Bemis ST-604 TPU substrate, a pattern of a series of interdigitated composition lines were printed using a 280 mesh stainless steel screen. The patterned lines were dried at 130° C. for 10 min. in a forced air box oven. A normalized resistivity of 50 mohm/sq/mil was observed. The pattern was subjected to 50 wash and dry cycles (40° C. wash temperature). Resistance was measured before and after the 50 wash and dry cycles to determine the change. The resistance change is shown in Table 1.

Example 2

A circuit was produced as described in Example 1. The only difference was that an encapsulant layer of the invention was printed and dried on top of the conductive composition. The encapsulant composition used to form the encapsulant layer was comprised of 1 wt % fumed silica and 99 wt % organic medium identical to that used in Example 1, wherein the wt % are based on the total weight of the composition. Resistance was measured before and after the 50 wash and dry cycles to determine the change. The resistance change is shown in Table 1.

Comparative Experiment A

A circuit was produced as described in Example 1. The only difference was that the conductor composition contained two different resins, polyurethane and hydroxyl ether with lower % elongation than the polyurethane resin used in Example 1. Resistance was measured before and after the 50 wash and dry cycles to determine the change. The resistance change is shown in Table 1.

TABLE 1

| Sample | Resistance Change after 50 Wash/Dry Cycles |
| --- | --- |
| Example 1 | 1 ohm |
| Example 2 | 0.5 ohm |
| Comparative Exp. A | 6 ohm |

The results show the strikingly better results obtained in Examples 1 and 2 compared with Comparative Example A due to the use of the thermoplastic polyurethane resin. The use of the encapsulant further improves the performance (lower resistance change) compared to Example 1 and thus supports the use of these compositions for practical wearables applications such as functional clothing.

Example 3

A PTF conductor composition was prepared using Desmocoll® 406 polyurethane (Bayer Material Science LLC, Pittsburgh, Pa.) essentially as described in Example 1. The Desmocoll® 406 has a tensile stress necessary to achieve 100% elongation of 420 psi. A circuit was fabricated as follows. On a black TPU film, a pattern of a series of interdigitated composition lines were printed using a 230 mesh, 1.4 mil stainless steel screen. The printed lines were dried at 120° C. for 15 minutes. A track of the film 10 cm long and 1 cm wide was then stretched to an elongation of 15%. The initial resistance was 5 ohms and the resistance after the 15% elongation was 45 ohms for an increase of 40 ohms.

Example 4

A circuit was prepared and the resistance was measured essentially as described in Example 3. The only difference was that the polyurethane resin used in the PTF conductor composition was Desmocoll® 176 polyurethane (Bayer Material Science LLC, Pittsburgh, Pa.). The Desmocoll® 176 has a tensile stress necessary to achieve 100% elongation of 330 psi. The resistance increase after the 15% elongation was 12 ohms.

Example 5

A circuit was prepared and the resistance was measured essentially as described in Example 3. The only difference was that the polyurethane resin used in the PTF conductor composition was Desmocoll® 526 polyurethane (Bayer Material Science LLC, Pittsburgh, Pa.). The Desmocoll® 526 has a tensile stress necessary to achieve 100% elongation of 650 psi. The resistance increase after the 15% elongation was 13 ohms.

Comparative Experiment B

A circuit was prepared and the resistance was measured essentially as described in Example 3. The only difference was that the polyurethane resin used in the PTF conductor composition was Desmocoll® 530 polyurethane (Bayer Material Science LLC, Pittsburgh, Pa.). The Desmocoll® 530 has a tensile stress necessary to achieve 100% elongation of 1200 psi. The resistance increase after the 15% elongation was 75 ohms.

The resistance increases after a 15% elongation for Examples 3-5 and Comparative Experiment B are summarized in Table 2

TABLE 2

| Sample | Stress for 15% Elongation | Resistance Change |
| --- | --- | --- |
| Example 3 | 420 psi | 40 ohms |
| Example 4 | 330 psi | 12 ohms |
| Example 5 | 650 psi | 13 ohms |
| Comparative Exp. B | 1200 psi | 75 ohms |

Example 6

A composition was prepared as described in Example 1 with the exception that the conductive metal powder was composed of silver flake powder and silver chloride powder, obtained from Colonial Metals Company, Columbia, Pa. The average size of the silver chloride powder particles was 15 microns. The wt % of each component was:

| | |
| --- | --- |
| Silver flake | 44.07 |
| Silver chloride powder | 23.73 |
| Oreganic medium | 16.95 |
| Dowanol ™ DPM glycol ether | 15.25 |

A circuit was fabricated as described in Example 1 and was used successfully as an electrode in a wearables application.

What is claimed is:

1. A polymer thick film encapsulant paste composition comprising:
   (a) fumed silica; and
   (b) an organic medium comprising 5-50 wt % thermoplastic polyurethane resin dissolved in an organic solvent, said thermoplastic polyurethane resin having a per cent elongation of at least 200% and a tensile stress necessary to achieve 100% elongation of less than 1000 psi, wherein the weight percent is based on the total weight of said organic medium.

2. The polymer thick film encapsulant paste composition of claim 1, said polymer thick film encapsulant paste composition comprising 0.1 to 3 wt % fumed silica and 97 to 99.9 wt % organic medium, wherein the wt % are based on the total weight of said composition and wherein said thermoplastic polyurethane resin is selected from the group consisting of a polyester-based polymer, a urethane homopolymer and a predominantly linear hydroxyl polyurethane.

\* \* \* \* \*